(12) United States Patent
Zhao et al.

(10) Patent No.: US 12,106,934 B2
(45) Date of Patent: Oct. 1, 2024

(54) LINER, REACTION CHAMBER AND SEMICONDUCTOR PROCESSING EQUIPMENT

(71) Applicant: BEIJING NAURA MICROELECTRONICS EQUIPMENT CO., LTD., Beijing (CN)

(72) Inventors: Jinrong Zhao, Beijing (CN); Kai Chang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 248 days.

(21) Appl. No.: 16/638,688

(22) PCT Filed: Jul. 12, 2018

(86) PCT No.: PCT/CN2018/095437
§ 371 (c)(1),
(2) Date: Feb. 12, 2020

(87) PCT Pub. No.: WO2019/033878
PCT Pub. Date: Feb. 21, 2019

(65) Prior Publication Data
US 2021/0193434 A1  Jun. 24, 2021

(30) Foreign Application Priority Data

Aug. 17, 2017  (CN) .......................... 201710708391.6
Aug. 17, 2017  (CN) .......................... 201721033212.5

(51) Int. Cl.
*H01J 37/32*  (2006.01)
*H01J 37/305*  (2006.01)
(Continued)

(52) U.S. Cl.
CPC .... *H01J 37/3053* (2013.01); *H01J 37/32082* (2013.01); *H01J 37/32495* (2013.01);
(Continued)

(58) Field of Classification Search
CPC .......... H01J 37/32495; H01J 37/32623; H01L 21/67069
See application file for complete search history.

(56) References Cited

U.S. PATENT DOCUMENTS 5,641,375 A * 6/1997 Nitescu ............. H01J 37/32495
                                                  438/731
6,156,151 A * 12/2000 Komino ............. H01J 37/3244
                                                  118/723 R
(Continued)

FOREIGN PATENT DOCUMENTS

CN         1505695 A      6/2004
CN       103402299 A     11/2013
(Continued)

OTHER PUBLICATIONS

World Intellectual Property Organization (WIPO) International Search Report for PCT/CN2018/095437 Oct. 11, 2018 6 Pages.

*Primary Examiner* — Parviz Hassanzadeh
*Assistant Examiner* — Margaret Klunk
(74) *Attorney, Agent, or Firm* — ANOVA LAW GROUP, PLLC

(57) ABSTRACT

The present disclosure provides a liner, a reaction chamber, and a semiconductor processing device. The liner is disposed in the reaction chamber and includes a liner body being arranged around an inner side wall of the reaction chamber and is grounded; a first separator being arranged to surround a periphery of a base disposed in the reaction chamber, a lower end of the first separator being grounded through the base; a dielectric ring being arranged between an inner peripheral wall of the first separator and an outer (Continued)

peripheral wall of the base; and a second separator being arranged to be around a lower end of the liner body and an outer peripheral wall of the first separator. The liner provided in the present disclosure can prevent the system from generating resonance, thereby enhancing the process stability.

13 Claims, 5 Drawing Sheets

(51) Int. Cl.
H01L 21/3065 (2006.01)
H01L 21/67 (2006.01)
(52) U.S. Cl.
CPC .... *H01J 37/32623* (2013.01); *H01L 21/3065* (2013.01); *H01L 21/67069* (2013.01); *H01L 21/6719* (2013.01)

(56) References Cited

U.S. PATENT DOCUMENTS

| | | | | |
|---|---|---|---|---|
| 6,277,237 | B1 * | 8/2001 | Schoepp | H01J 37/32495 118/723 R |
| 2001/0054383 | A1 * | 12/2001 | Pu | H01J 37/321 156/345.48 |
| 2002/0142611 | A1 * | 10/2002 | O'Donnell | B01J 19/0073 438/710 |
| 2004/0027781 | A1 * | 2/2004 | Hanawa | H01J 37/32724 361/234 |
| 2007/0238307 | A1 | 10/2007 | Yamashita | |
| 2008/0063809 | A1 | 3/2008 | Lee et al. | |
| 2008/0236752 | A1 * | 10/2008 | Honda | H01J 37/32633 156/345.43 |
| 2009/0188625 | A1 * | 7/2009 | Carducci | H01J 37/32467 156/345.1 |
| 2009/0250169 | A1 * | 10/2009 | Carducci | H01L 21/67069 156/345.34 |
| 2012/0003836 | A1 * | 1/2012 | Kellogg | H01L 21/6719 118/723 R |
| 2012/0273134 | A1 * | 11/2012 | Sexton | H01J 37/32174 156/345.44 |
| 2014/0127911 | A1 * | 5/2014 | Shih | C25D 7/02 438/710 |
| 2015/0140812 | A1 | 5/2015 | Zope et al. | |

FOREIGN PATENT DOCUMENTS

| | | |
|---|---|---|
| CN | 103811258 A | 5/2014 |
| CN | 104746043 A | 7/2015 |
| CN | 105304519 A | 2/2016 |
| CN | 106783490 A | 5/2017 |
| CN | 107578975 A | 1/2018 |
| CN | 207183210 U | 4/2018 |
| JP | 2002184756 A * | 6/2002 |
| TW | 420847 B | 2/2001 |
| TW | 200947172 A | 11/2009 |
| TW | 201334104 A | 8/2013 |
| TW | 201336358 A | 9/2013 |

* cited by examiner

LINER, REACTION CHAMBER AND SEMICONDUCTOR PROCESSING EQUIPMENT

CROSS-REFERENCES TO RELATED APPLICATIONS

This application is a national phase entry under 35 U.S.C. § 371 of International Application No. PCT/CN2018/095437, filed on Jul. 12, 2018, which claims the priority to Chinese Patent Application No. 201710708391.6 and Chinese Patent Application No. 201721033212.5 filed on Aug. 17, 2017, the entire contents of which are incorporated herein by reference.

TECHNICAL FIELD

The present disclosure relates to the field of semiconductor manufacturing technology and, more specifically, to a liner, a reaction chamber, and a semiconductor processing device.

BACKGROUND

In the etching process, a large number of processing parameters of the plasma reaction chamber need to be strictly controlled to maintain high quality etching results. In particular, the optimal design of the internal structure of the chamber has a decisive effect on the process performance and process results on the device itself.

In conventional technology, a liner is generally added inside the reaction chamber of the etching machine. The liner is mainly used to improve the effective fluidity of the plasma inside the chamber, and at the same time, restrain the plasma, such that the inner wall and the bottom of the chamber can be protected from being etched. In addition, the machine chamber is easier to maintain with the additional liner.

The conventional liner is arranged around the inside of the side wall of the reaction chamber, and the upper end of the liner is grounded. The lower end of the liner includes a horizontal bending portion bent toward the inside thereof and a vertical bending portion bent vertically upward from the horizontal bending portion. In particular, the vertical bending portion surrounds the edge of the base, and is used to change the impedance model of the base and its surroundings, which enhances the electrical field strength at the edge of the base, thereby improving the etching efficiency of the wafer edge and the etching uniformity of the wafer. The horizontal bending portion is used to prevent the plasma from passing through the gap between the inner liner and the base and into the bottom of the chamber, thereby protecting the bottom of the chamber from being etched.

The liner described above may unavoidably have problems in practical applications as discussed below.

Since only the upper end of the liner is grounded, the loop of the liner is longer in the radio frequency (RF) environment, and the bent structure of the liner may present a larger inductance characteristic. At the same time, a capacitance characteristic can be formed between the vertical bending portion described above and the base such that the inner line may equivalently form an equivalent model as shown in FIG. 1. The formula of the resonance frequency of the equivalent model may be:

$$f = \frac{1}{2\pi\sqrt{LC}},$$

where f may be the resonance frequency; L may be the equivalent inductance generated by the bent structure of the liner; and C may be the equivalent capacitance generated by the vertical bending portion and the base. When the frequency of the RF environment is close to the resonance frequency of the system, the system may generate a resonance, which can cause a sudden change in the DC self-bias of the RF environment. As shown in FIG. 2, the DC self-bias voltage suddenly decreases, and an abnormal curve appears, which can affect the process stability.

SUMMARY

The present disclosure aims to solve at least one of the technical problems exist in the conventional technology, and proposes a liner, a reaction chamber, and a semiconductor processing device, which can prevent the system from generating resonance, thereby increasing the process stability.

In order to achieve the purpose of the present disclosure, a liner is provided and disposed in a reaction chamber. The liner includes a liner body being arranged around an inner side wall of the reaction chamber and is grounded; a first separator being arranged to surround a periphery of a base disposed in the reaction chamber, a lower end of the first separator being grounded through the base; a dielectric ring being arranged between an inner peripheral wall of the first separator and an outer peripheral wall of the base; and a second separator being arranged to around a lower end of the liner body and an outer peripheral wall of the first separator.

In some embodiments, the second separator is integrally connected to the liner body.

In some embodiments, the second separator is connected to the first separator as a single piece.

In some embodiments, the liner body is connected to the second separator as a single piece, and the second separator is connected to the first separator as a single piece.

In some embodiments, the lower end of the first separator projects vertically downward with respect to a lower end surface of the second separator.

In some embodiments, an upper end of the first separator is flush with an upper end of the dielectric ring, and the lower end of the first separator is flush with a lower end of the dielectric ring.

As another technical solution, the present disclosure further provides a reaction chamber including a base in the reaction chamber. The reaction chamber further includes the above-mentioned liner provided in the present disclosure.

In some embodiments, the base includes a base body, an isolation layer, and a metal interface plate being arranged from top to bottom, where the metal interface plate is grounded and the lower end of the first separator is electrically connected to the metal interface plate.

In some embodiments, the metal interface plate includes a first protrusion protruding relative to an outer peripheral wall of the isolation layer and a second protrusion at a lower part of the first separator and protruding from the outer peripheral wall of the first separator. Further, the first protrusion and the second protrusion overlap each other and are fixedly connected by a screw.

In some embodiments, one or more conductive layers are being disposed between two surfaces where the second protrusion is in contact with the first protrusion.

In some embodiments, the conductive layer is being disposed on at least one of the two surfaces where the second protrusion is in contact with the first protrusion by electroplating.

As another technical solution, the present disclosure further provides a semiconductor processing device including the above-mentioned reaction chamber provided in the present disclosure.

The present disclosure includes the following beneficial effects.

The liner provided in the present disclosure includes a liner body, a first separator, and a second separator, where the liner body is being arranged to surround the inner side wall of the reaction chamber and is grounded. The first separator surrounds the periphery of the base, and the lower end of the first separator is grounded through the base. In addition, a dielectric ring is disposed between the inner peripheral wall of the first separator and the outer peripheral wall of the base. The second separator is disposed between the lower end of the liner body and the outer peripheral wall of the first separator to prevent the plasms from passing through the gap between the liner body and the first separator. Since the lower end of the first separator is grounded through the base, the capacitance generated by the first separator ad the base cannot generate resonance. In addition, the magnitude of the capacitance generated between the first separator and the liner body is much smaller than the capacitance generated between the first separator and the base. At the same time, since the lower end of the first separator is grounded, the inductance generated by the liner is relatively small. Therefore, based on the formula of the resonance frequency, it should be apparent that since the resonance frequency of the system is greatly increased, the frequency of the RF environment may be difficult to reach the resonance frequency of the system, thereby preventing the system from generating resonance, which may increase the process stability.

The reaction chamber provided in the present disclosure can prevent the system from generating resonance by using the above-mentioned liner provided in the present disclosure, thereby increasing the process stability.

The semiconductor processing device provided in the present disclosure can prevent the system from generating resonance by using the above-mentioned reaction chamber provided in the present disclosure, thereby increasing the process stability.

DETAILED DESCRIPTION OF THE EMBODIMENTS

To facilitate understanding of the embodiments of the present disclosure by a person of ordinary skill in the art, the liner, reaction chamber, and semiconductor processing device provided in the embodiments of the present disclosure will be described below with reference to the accompanying drawings.

Figure 1:
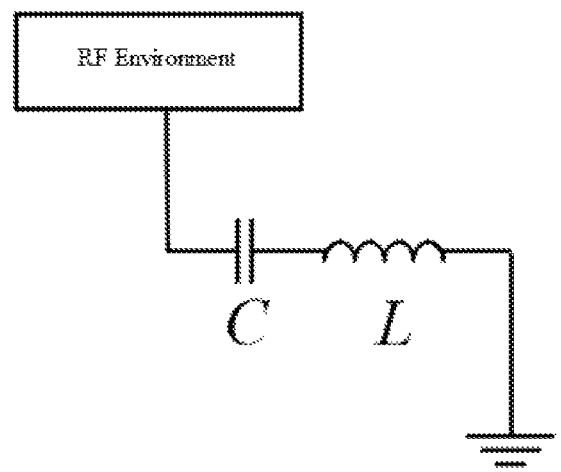
FIG. 1 is a diagram of an equivalent model of an equivalent formation of a conventional liner.
Figure 2:
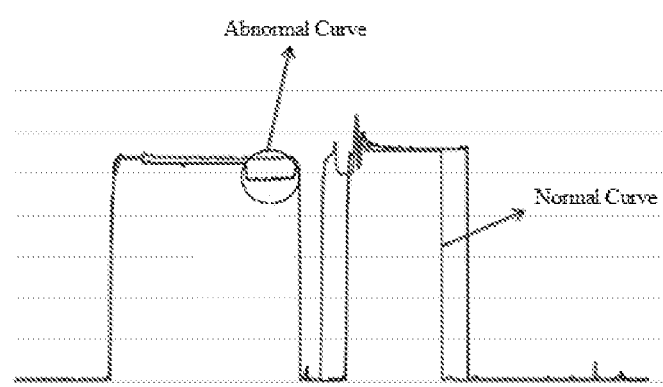
FIG. 2 is a graph of a self-bias voltage acquired using the conventional liner.
Figure 3A:
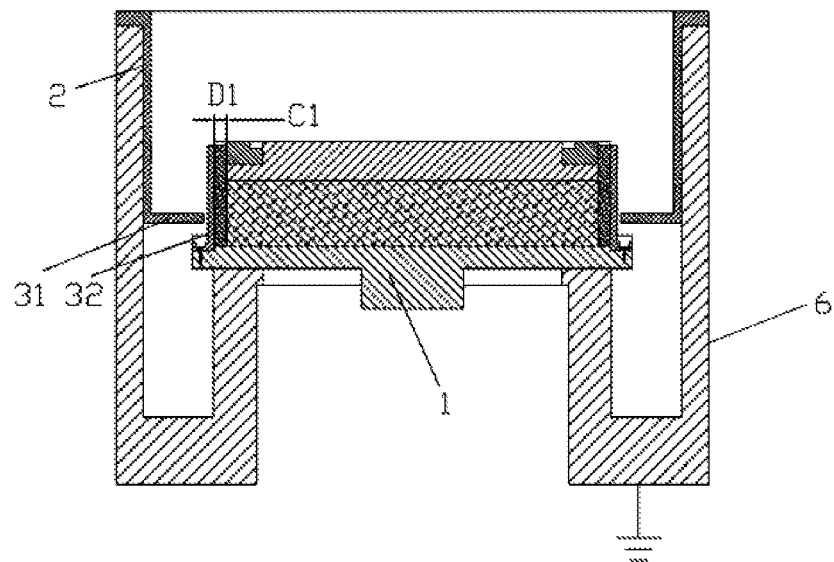
FIG. 3A is a cross-sectional view of a reaction chamber according to a first embodiment of the present disclosure.
Figure 3B:
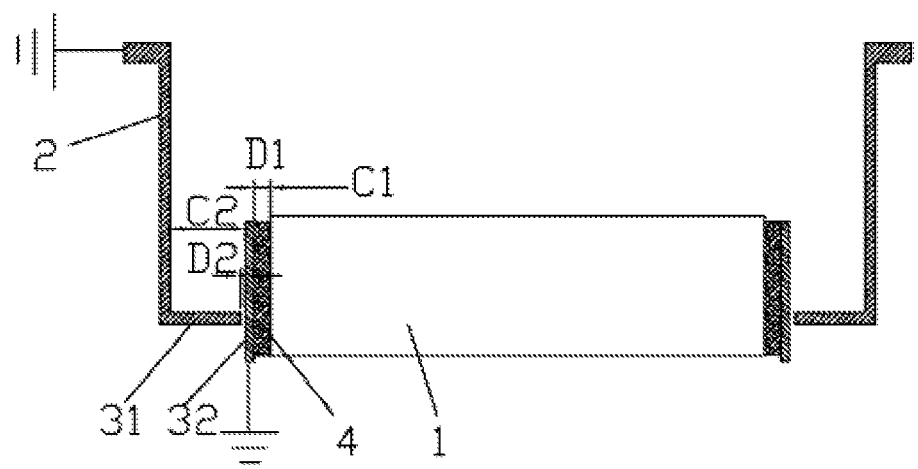
FIG. 3B is a cross-sectional view of a liner according to a first embodiment of the present disclosure.

Referring to FIG. 3A and FIG. 3B, an embodiment of the present disclosure provides a liner, which is disposed in a reaction chamber 6. The reaction chamber 6 further includes a base 1 configured to carry a workpiece to be processed, and the base 1 is grounded. The liner includes a liner body 2, a first separator 32, and a second separator 31. In particular, the liner body 2 is being arranged to surround the inner side wall of the reaction chamber 6 and is grounded. In the present embodiment, the upper end of the liner body 2 is connected to the side wall of the reaction chamber 6 and may be electrically conductive. Further, the side wall of the reaction chamber 6 is grounded, as such, the liner body 2 is also grounded.

The first separator 32 surrounds the periphery of the base 1, and the lower end of the first separator 32 may be grounded through the base 1. In addition, a dielectric ring 4 is disposed in a space D1 between the inner peripheral wall of the first separator 32 and the outer peripheral wall of the base 1. The second separator 31 is disposed between the lower end of the liner body 2 and the outer peripheral wall of the first separator 32 to prevent the plasms from passing through the gap between the liner body 2 and the first separator 32 and spreading to the bottom of the reaction chamber 6.

Since the surface of the base 1 and the plasma sheath layer may exhibit a capacitive effect and generate an electric field, the electrical field at the edge of the base 1 may twist outward and the field strength may decrease, thereby reducing the etching efficiency of the wafer edge. As such, by providing the first separator 32 described above, and the dielectric ring 4 between the inner peripheral wall of the first separator 32 and the outer peripheral wall of the base 1, the capacitance generated by the first separator 32 and the base 1 may be C1, which may change the impedance model of the base 1 and its surrounding environment and enhance the electric field strength at the edge of the base. Therefore, the etching efficiency of the wafer edge may be improved and the etching uniformity of the wafer may be increase. The dielectric ring 4 can increase the capacitance C1. In some embodiments, for example, the dielectric ring 4 may be made of ceramic.

In practical applications, based on the respective functions of the first separator 32 and the second separator 31, the radial thickness of the first separator 32 may be much smaller than its axial length. That is, the first separator 32 may be cylindrical to ensure a capacitive effect is formed between the first separator 32 and the base 1. The radial thickness of the second separator 31 may ensure that the second separator 31 can cover the gap between the lower end of the liner body 2 and the outer peripheral wall of the first separator 32. In some embodiments, the second separator 31 may be an annular plate body.

In some embodiments, the lower end of the first separator 32 may project vertically downward with respect to the lower end surface of the second separator 31 to facilitate grounding.

In addition, in some embodiments, the upper end of the first separator 32 may be flush with the upper end of the dielectric ring 4 and the lower end of the first separator may be flush with the lower end of the dielectric ring 4 to increase the capacitance C1 between the first separator 32 and the base 1.

In the present embodiment, the second separator 31 may be integrated with the liner body 2. In other words, the second separator 31 may be a horizontal bending portion formed by bending the lower end of the liner body inward. In addition, a free end of the second separator 31 and the outer peripheral wall of the first separator 32 may be spaced apart from each other, and the separation distance may be D2, such that the first separator 32 may be separated from the liner body 2. It should be noted that the distance D2 between the free end of the second separator 31 and the outer peripheral wall of the first separator 32 should be reduced as much as possible to prevent the plasma from passing through the gap between the second separator 31 and the outer peripheral wall of the first separator 32. In addition, when the separation distance D2 is sufficiently small, the free end of the second separator 31 may be equivalent to the ground.

Figure 3C:
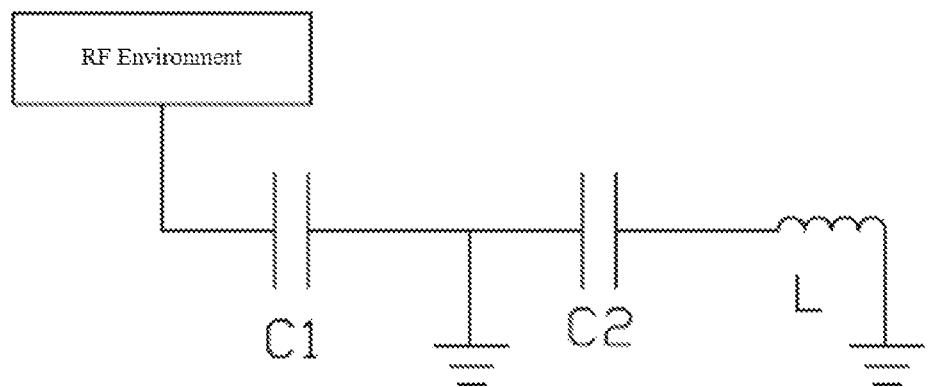
FIG. 3C is a diagram of an equivalent model formed by the liner according to a first embodiment of the present disclosure.

Since the lower end of the first separator 32 is grounded through the base 1, the equivalent model formed by the liner is shown in FIG. 3C, and the capacitance C1 generated by the first separator 32 and the base 1 may not generate resonance. In addition, the capacitance C2 generated between the first separator 32 and the liner body 2 may be much smaller than the capacitance C1 described above. At the same time, since the lower end of the first separator 32 is grounded through the base 1, it is equivalent to the liner body 2 without the vertical bending portion in the conventional art, as such, the inductance is relatively small. Therefore, based on the formula of the resonance frequency, it should be apparent that since the capacitance C2 and the inductance are greatly reduced, the resonance frequency of the system is greatly increased, such that the frequency of the RF environment may be difficult to reach the resonance frequency of the system, thereby preventing the system from generating resonance, which may increase the process stability.

Figure 4:
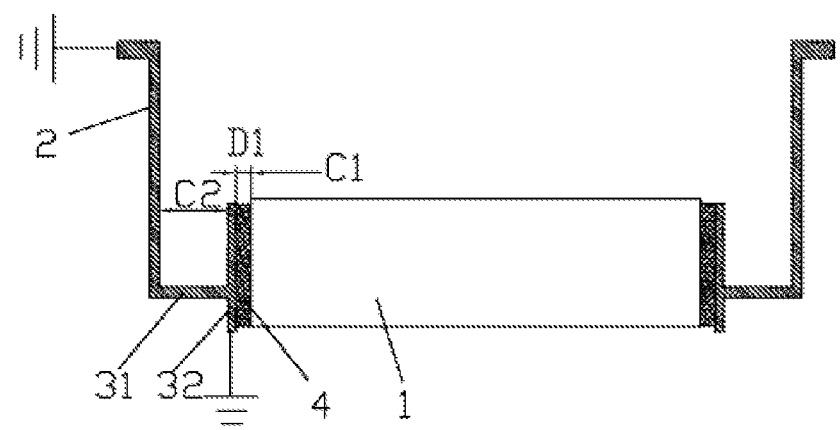
FIG. 4 is a cross-sectional view of the liner according to a second embodiment of the present disclosure.

Referring to FIG. 4, compared with the previous embodiments described above, the reaction chamber provided in the present embodiment of the present disclosure is different in that the structures of the first separator 32 and the second separator 31 are different.

More specifically, the liner body 2 is connected to the second separator 31 as a single piece, and the second separator 31 is connected to the first separator 32 as a single piece. In particular, the second separator 31 may be the horizontal bending portion formed by bending the second separator 31 inward from the lower end of the liner body 2, and the free end of the horizontal bending portion may be connected to the outer peripheral wall of the first separator as a single piece. As such, the liner may form the equivalent model as shown in FIG. [3B] 3C, such that the frequency of the RF environment may be difficult to reach the resonance frequency of the system, thereby preventing the system from generating resonance, which may increase the process stability.

Figure 5:
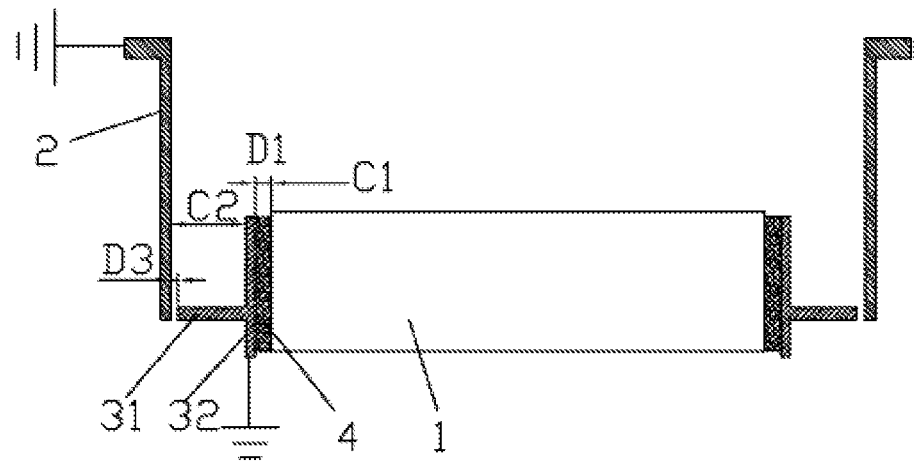
FIG. 5 is a cross-sectional view of the liner according to a third embodiment of the present disclosure.

Referring to FIG. 5, compared with the previous embodiments described above, the reaction chamber provided in the present embodiment of the present disclosure is different in that the structures of the first separator 32 and the second separator 31 are different More specifically, the second separator 31 and the first separator 32 are connected as a single piece. That is, the inner peripheral wall of the second separator 31 and the outer peripheral wall of the first separator 32 are connected as a single piece. As such, the liner may form the equivalent model as shown in FIG. 3C. Further, since the loop of the liner body 2 is further reduced, the inductance of the liner body 2 may be further reduced. In addition, a gap D3 may be disposed between the outer peripheral wall of the second separator 31 and the liner body 2, and the gap D3 may be as small as possible to prevent the plasma from passing through the gap between the second separator 31 and the liner body 2.

In view of the foregoing embodiments, by using a split structure for the liner provided in the foregoing embodiments of the present disclosure, the system resonance may be avoided, thereby increasing the process stability.

As another technical solution, an embodiment of the present disclosure further provides a reaction chamber having a structure similar to the reaction chamber 6 shown in FIG. 3A. More specifically, a based 1 and the liner provided in each of the foregoing embodiments of the present disclosure may be disposed in the reaction chamber 6.

Figure 6A:
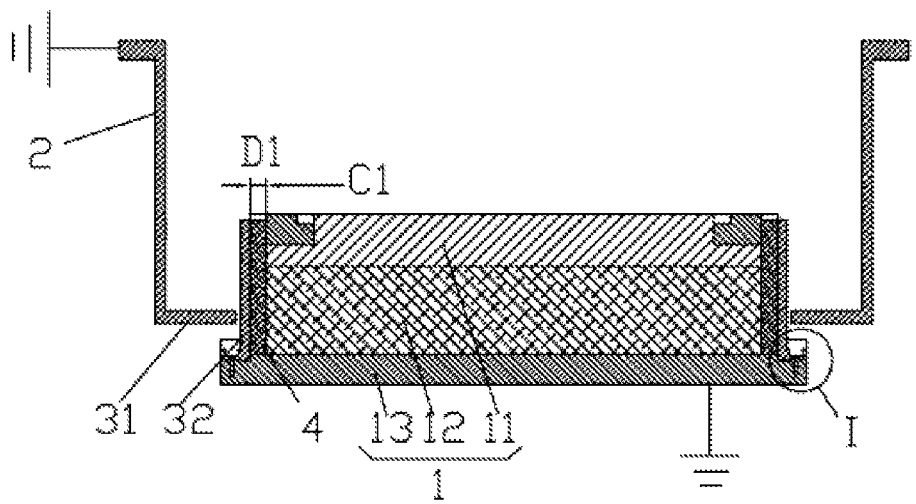
FIG. 6A is a cross-sectional view of the liner of the reaction chamber according to a fourth embodiment of the present disclosure.

In the present embodiment, as shown in FIG. 6A, the base 1 includes a base body 11, an isolation layer 12, and a metal interface plate 13 arranged from top to bottom, where the base body may be configured to carry a wafer. The isolation layer 12 may be made of an insulating material such as ceramic, and the isolation layer 12 may be used to electrically insulate the base body 11 from the metal interface plate 13. The metal interface plate 13 is grounded. In addition, the lower end of the first separator 32 may be grounded by being electrically connected to the metal interface plate 13.

Figure 6B:
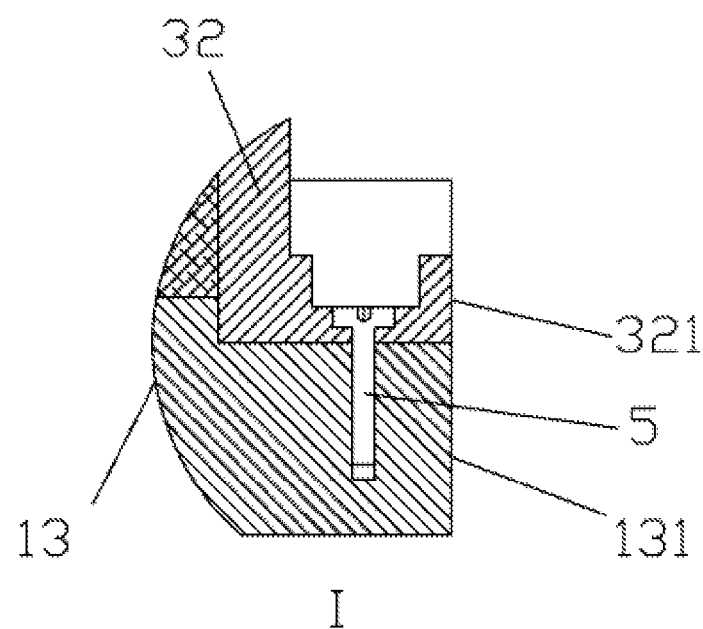
FIG. 6B is an enlarged view of an area I in FIG. 6A.

In order to ensure that the lower end of the first separator 32 and the metal interface plate 13 have good electrical conductivity, as shown in FIG. 6B, the metal interface plate 13 includes a first protrusion 131 protruding from the outer peripheral wall of the isolation layer 12, and a second protrusion 321 protruding from the outer peripheral wall of the first separator 32 disposed at the lower end of the first separator 32, where the second protrusion 321 and the first protrusion 131 are disposed to overlap each other and fixedly connected by a screw 5. By using the second protrusion 321 and the first protrusion 131, the contact area between the first separator 32 and the metal interface plate 13 may be increased, thereby ensuring that the lower end of the first separator 32 and the metal interface plate 13 have good electrical conductivity.

Further, in some embodiments, one or more conductive layers (not shown) may be disposed between the two surfaces of the second protrusion 321 and the first protrusion 131 that are in contact with each other, such that the second protrusion 321 may be in good contact with the first protrusion 131. More specifically, the conductive layer may be disposed on at least one of the two surfaces where the second protrusion 321 and the first protrusion 131 are in contact by electroplating. That is, the conductive layer may be electroplated on the lower surface of the second protrusion 321 and/or the top surface of the first protrusion 131.

The reaction chamber provided in the embodiments of the present disclosure can prevent the system from generating resonance by using the liner provided in the foregoing embodiments of the present disclosure, thereby increasing the process stability.

As another technical solution, an embodiment of the present disclosure further provides a semiconductor processing device, and the semiconductor processing device may include a reaction chamber provided in the embodiments of the present disclosure.

The semiconductor processing device provided in the embodiments of the present disclosure can prevent the system from generating resonance by using the reaction chamber provided in the foregoing embodiments of the present disclosure, thereby increasing the process stability.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present disclosure, and these variations and improvements shall fall into the protection scope of the embodiments of the present disclosure.

What is claimed is:

1. A reaction chamber comprising:
   a liner disposed in the reaction chamber; and
   a base disposed in the reaction chamber,
   the liner including:
   a liner body being arranged around an inner side wall of the reaction chamber, and an upper end of the liner body being electrically connected to a top of the inner side wall of the reaction chamber to cause the liner body to be grounded;
   a first separator being arranged to surround a periphery of the base, a lower end of the first separator being grounded through the base, wherein the base includes a base body, an isolation layer, and a metal interface plate being arranged from top to bottom, the metal interface plate is grounded, the lower end of the first separator is electrically connected to the metal interface plate, an uppermost surface of the first separator is higher than an uppermost surface of the isolation layer, and a lowermost surface of the first separator is lower than a lowermost surface of the isolation layer;
   a dielectric ring being arranged between an inner peripheral wall of the first separator and an outer peripheral wall of the base, an uppermost surface of the dielectric ring being coplanar with the uppermost surface of the first separator, a lowermost surface of the dielectric ring being higher than the lowermost surface of the first separator and being coplanar with the lowermost surface of the isolation layer, and both the lowermost surface of the dielectric ring and the lowermost surface of the first separator being in contact with the metal interface plate; and
   a second separator being arranged to around a lower end of the liner body and an area of an outer peripheral wall of the first separator.

2. The reaction chamber of claim 1, wherein the metal interface plate includes a first protrusion protruding relative to an outer peripheral wall of the isolation layer, the first separator includes a second protrusion at a lower part of the first separator and protruding from the outer peripheral wall of the first separator, and the first protrusion and the second protrusion overlap each other and are fixedly connected by a screw, to increase a contact area between the first separator and the metal interface place to provide an electrical conductivity between the first separator and the metal interface plate.

3. The reaction chamber of claim 2, wherein one or more conductive layers are disposed between two surfaces where the second protrusion is in contact with the first protrusion.

4. The reaction chamber of claim 3, wherein a conductive layer of the one or more conductive layers is disposed on at least one of the two surfaces where the second protrusion is in contact with the first protrusion by electroplating.

5. The reaction chamber of claim 1, wherein the area of the outer peripheral wall of the first separator is overlapped with a sidewall of the isolation layer along an extending direction of the second separator, the extending direction being a radial direction.

6. A semiconductor processing device comprising:
   a reaction chamber including a base and a liner disposed in the reaction chamber, the liner comprising:
   a liner body being arranged around an inner side wall of the reaction chamber, and an upper end of the liner body being electrically connected to a top of the inner side wall of the reaction chamber to cause the liner body to be grounded;
   a first separator being arranged to surround a periphery of the base, a lower end of the first separator being grounded through the base, wherein the base includes a base body, an isolation layer, and a metal interface plate being arranged from top to bottom, the metal interface plate is grounded, the lower end of the first separator is electrically connected to the metal interface plate, an uppermost surface of the first separator is higher than an uppermost surface of the isolation layer, and a lowermost surface of the first separator is lower than a lowermost surface of the isolation layer;
   a dielectric ring being arranged between an inner peripheral wall of the first separator and an outer peripheral wall of the base, an uppermost surface of the dielectric ring being coplanar with the uppermost surface of the first separator, a lowermost surface of the dielectric ring being higher than the lowermost surface of the first separator and being coplanar with the lowermost surface of the isolation layer, and both the lowermost surface of the dielectric ring and the lowermost surface of the first separator being in contact with the metal interface plate; and
   a second separator being arranged to around a lower end of the liner body and an area of an outer peripheral wall of the first separator.

7. The semiconductor processing device of claim 6, wherein the second separator is integrally connected to the liner body.

8. The semiconductor processing device of claim 7, wherein the lower end of the first separator projects vertically downward with respect to a lower end surface of the second separator.

9. The semiconductor processing device of claim 6, wherein the second separator is connected to the first separator as a single piece.

10. The semiconductor processing device of claim 6, wherein the liner body is connected to the second separator as a single piece, and the second separator is connected to the first separator as a single piece.

11. The semiconductor processing device of claim 6, wherein the metal interface plate includes a first protrusion protruding relative to an outer peripheral wall of the isolation layer, the first separator includes a second protrusion at a lower part of the first separator and protruding from the outer peripheral wall of the first separator, and the first protrusion and the second protrusion overlap each other and are fixedly connected by a screw, to increase a contact area between the first separator and the metal interface place to provide an electrical conductivity between the first separator and the metal interface plate.

12. The semiconductor processing device of claim 11, wherein a conductive layer is disposed between two surfaces where the second protrusion is in contact with the first protrusion.

13. The semiconductor processing of claim 6, wherein the area of the outer peripheral wall of the first separator is overlapped with a sidewall of the isolation layer along an extending direction of the second separator, the extending direction being a radial direction.

\* \* \* \* \*